(12) United States Patent
Sawajiri

(10) Patent No.: US 11,458,930 B2
(45) Date of Patent: Oct. 4, 2022

(54) VEHICLE ANTI-THEFT DEVICE, VEHICLE ANTI-THEFT SYSTEM, VEHICLE ANTI-THEFT METHOD, AND ON-BOARD DEVICE

(71) Applicant: CLARION CO., LTD., Saitama (JP)

(72) Inventor: Haruhiko Sawajiri, Atsugi (JP)

(73) Assignee: CLARION CO., LTD., Saitama (JP)

( * ) Notice: Subject to any disclaimer, the term of this patent is extended or adjusted under 35 U.S.C. 154(b) by 372 days.

(21) Appl. No.: 16/620,534

(22) PCT Filed: Feb. 20, 2018

(86) PCT No.: PCT/JP2018/005975
§ 371 (c)(1),
(2) Date: Dec. 9, 2019

(87) PCT Pub. No.: WO2018/225303
PCT Pub. Date: Dec. 13, 2018

(65) Prior Publication Data
US 2020/0122689 A1    Apr. 23, 2020

(30) Foreign Application Priority Data
Jun. 9, 2017 (JP) .............................. JP2017-114534

(51) Int. Cl.
*B60R 25/40* (2013.01)
*G01R 31/3835* (2019.01)
(Continued)

(52) U.S. Cl.
CPC .......... *B60R 25/403* (2013.01); *B60R 25/045* (2013.01); *B60R 25/33* (2013.01); *G01R 31/3835* (2019.01); *G01S 19/13* (2013.01)

(58) Field of Classification Search
CPC ..... B60R 25/403; B60R 25/045; B60R 25/33; B60R 25/102; G01R 31/3835; G01S 19/13; G01S 19/16
See application file for complete search history.

(56) References Cited

U.S. PATENT DOCUMENTS

| | | | |
|---|---|---|---|
| 2011/0254654 A1 | 10/2011 | Lo et al. | |
| 2012/0274276 A1* | 11/2012 | Endo | ...................... B60L 53/65 320/109 |

FOREIGN PATENT DOCUMENTS

| | | |
|---|---|---|
| JP | 2010-089597 A | 4/2010 |
| JP | 2011-183839 A | 9/2011 |

(Continued)

OTHER PUBLICATIONS

International Search Report, PCT/JP2018/005975, dated May 15, 2018, 2pgs.

*Primary Examiner* — Metasebia T Retebo
(74) *Attorney, Agent, or Firm* — Volpe Koenig

(57) ABSTRACT

Start-up of an engine is prevented, and easier installation to a vehicle can be achieved. A device includes: connectors configured to be connected to battery cables of a vehicle; a communication unit configured to communicate with an external device; a power consuming device configured to consume power of a vehicle battery; and an overall control unit configured to perform control of causing consumption of power of the vehicle battery by using the power consuming device, when the overall control unit receives a signal for instructing consumption of the vehicle battery from the external device through the communication unit.

11 Claims, 12 Drawing Sheets

(51) Int. Cl.
*B60R 25/045* (2013.01)
*B60R 25/33* (2013.01)
*G01S 19/13* (2010.01)

(56) References Cited

FOREIGN PATENT DOCUMENTS

JP 2012-231650 A 11/2012
JP 2013-138575 A 7/2013

\* cited by examiner

VEHICLE ANTI-THEFT DEVICE, VEHICLE ANTI-THEFT SYSTEM, VEHICLE ANTI-THEFT METHOD, AND ON-BOARD DEVICE

TECHNICAL FIELD

The present invention relates to a vehicle anti-theft device, a vehicle anti-theft system, a vehicle anti-theft method, and an on-board device. The present invention claims priority to Japanese Patent Application No. 2017-114534, filed on Jun. 9, 2017, the contents of which are incorporated by reference herein in its entirety in designated states where the incorporation of documents by reference is approved.

BACKGROUND ART

Regarding a vehicle anti-theft device, PTL 1 describes as follows. "A circuit board installed inside a battery container includes a main MCU circuit 20, a current sensing circuit 30, and an anti-theft functional circuit 40, and a switch 50 is installed on either of the output ends of a positive electrode power supply line 11 and a negative electrode power supply line 12 of the battery 10. The main MCU circuit reads the amperage from the current sensing circuit in a case the anti-theft functional circuit is on, and opens the switch when the read amperage is over the current judging value. This shuts off the current feeding of the battery to the outside so as to disable the engine to start."

CITATION LIST

Patent Literature

PTL 1: JP 2010-89597 A

SUMMARY OF INVENTION

Technical Problem

In recent years, to prevent stealing (unpermitted keeping) of a vehicle, an anti-theft device may be in some cases installed to a vehicle. For example, an anti-theft device, such as an immobilizer, is arranged around a key cylinder. The immobilizer, however, has problems of requiring technical knowledge for installation as well as requiring time and costs, because wiring for controlling start-up of an engine varies for each individual vehicle, and disassembly of parts around a key cylinder is required.

In the vehicle anti-theft device of PTL 1, the switch is remotely opened. In this manner, external electric current output of the battery power supply is blocked, preventing an engine from starting up. However, in the technique of PTL 1, for example, a bypass that allows an electric current from the battery power supply to flow in a different path may be arranged in a form of bridging over the switch. In such a case, an engine may be started.

In view of this, the present invention has an object to provide a vehicle anti-theft device that makes it difficult to start-up of an engine, and that can be more easily installed to a vehicle.

Solution to Problem

The present application includes a plurality of solutions to at least a part of the problems described above. One example of the solutions is as follows. A vehicle anti-theft device according to one aspect of the present invention to solve the problems described above includes connectors configured to be connected to battery cables of a vehicle; a communication unit configured to communicate with an external device; a power consuming device configured to consume power of a vehicle battery; and an overall control unit configured to perform control of causing consumption of power of the vehicle battery by using the power consuming device, when the overall control unit receives a signal for instructing consumption of the vehicle battery from the external device through the communication unit.

Advantageous Effects of Invention

According to a vehicle anti-theft device of the present invention, arranging a bypass for starting up an engine is difficult, and easier installation to a vehicle can be achieved.

Note that problems, configurations, effects, and the like, other than those described above will become apparent in the following description of the embodiments.

DESCRIPTION OF EMBODIMENTS

Each embodiment of the present invention will be described below with reference to the drawings.

First Embodiment

Figure 1:
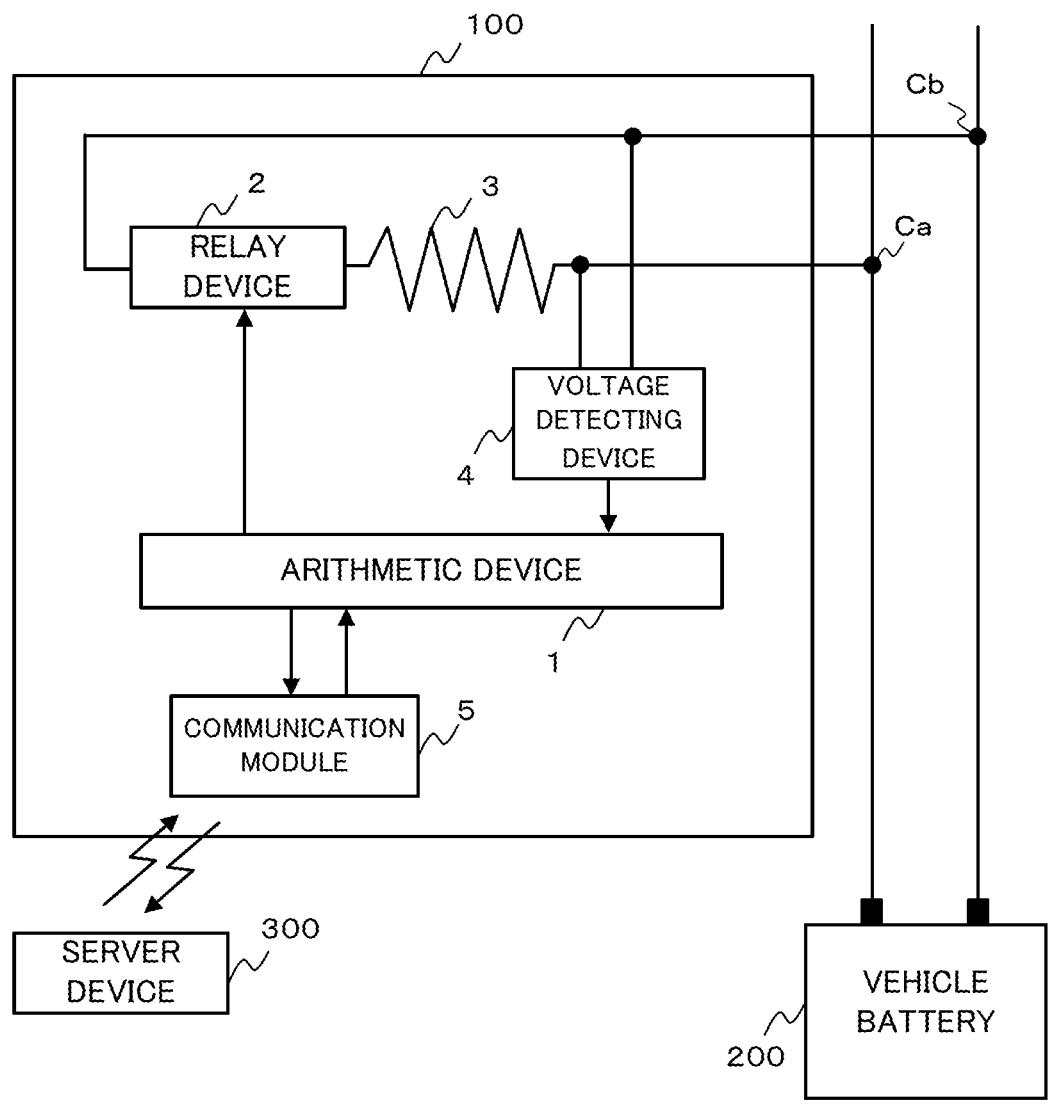
FIG. 1 is a diagram illustrating an example of a schematic configuration of a vehicle anti-theft device according to a first embodiment.

FIG. 1 is a diagram illustrating an example of a schematic configuration of a vehicle anti-theft device 100 according to a first embodiment. The vehicle anti-theft device 100 is connected to battery cables of a vehicle by connectors Ca and Cb. Specifically, the vehicle anti-theft device 100 is connected between a positive electrode of a battery (hereinafter referred to as a "vehicle battery") 200 mounted on the vehicle and a frame ground of a vehicle frame (chassis) having the same potential as the potential of a negative electrode of the vehicle battery 200 by the connectors Ca and Cb, and is thereby installed to the vehicle. The positive electrode of the vehicle battery 200 is routed to be easily connected to a fuse box, an audio harness, and the like, for example, and it is sufficient that the frame ground be a vehicle body frame. Thus, the vehicle anti-theft device 100 can be easily installed to the vehicle, without the necessity of special technical knowledge.

As illustrated in FIG. 1, the vehicle anti-theft device 100 includes an arithmetic device 1, a relay device 2, a power consuming device 3, a voltage detecting device 4, and a communication module 5.

The arithmetic device 1 is a central unit that performs various types of processing of the vehicle anti-theft device 100. The arithmetic device 1 performs control of the relay device 2, based on information acquired from a server device 300 that is connected with the communication module 5, for example. Specifically, the arithmetic device 1 controls operation of the relay device 2 by outputting an electrical signal (e.g., an electrical signal indicating a signal level of High) to the relay device 2, and by stopping the output.

Such an arithmetic device 1 is implemented by a system on a chip (SOC), for example. Specifically, the arithmetic device 1 includes a central processing unit (CPU) that executes various types of processing, such as arithmetic operation and control of each device connected to the arithmetic device 1, a random access memory (RAM) that temporarily stores information and arithmetic results, and a read only memory (ROM) that stores a boot program or the like that is executed by the CPU.

The relay device 2 is a device that switches ON and OFF of an embedded switch, based on the electrical signal acquired from the arithmetic device 1. Specifically, the relay device 2 turns on the switch during the time when the relay device 2 is acquiring the electrical signal from the arithmetic device 1. The relay device 2 turns off the switch during the time when the relay device 2 is not acquiring any electrical signal from the arithmetic device 1. Note that, when the switch is turned on, an electric current from the vehicle battery 200 flows through the power consuming device 3 that is coupled to the relay device 2, and thus power of the vehicle battery 200 is consumed.

The power consuming device 3 is a device that consumes power of the vehicle battery 200, and is implemented with a heat generating device, such as a resistor, for example. The power consuming device 3 is coupled to the relay device 2. The power consuming device 3 converts the electric current that flows from the vehicle battery 200 when the switch of the relay device 2 is turned on into thermal energy or the like. In this manner, the power consuming device 3 consumes power of the vehicle battery 200.

The voltage detecting device 4 is a device that detects a voltage of the vehicle battery 200. The voltage detecting device 4 constantly detects a voltage of the vehicle battery 200, and outputs the detected voltage to the arithmetic device 1.

The communication module 5 is a device that transmits and receives information to and from an external device (in this example, the server device 300). The communication module 5 receives a signal for instructing power consumption of the vehicle battery 200 from the server device 300. Specifically, the communication module 5 receives an instruction signal (hereinafter referred to as a "relay ON signal") for turning on the switch of the relay device 2, and outputs the received relay ON signal to the arithmetic device 1.

The schematic configuration of the vehicle anti-theft device 100 has been described in the above.

Note that the server device 300 is a device owned by, for example, a car loan company (which may be a car dealer, a company that provides a service of installing the vehicle anti-theft device 100, or the like), and manages information of each user who took out a car loan and purchased a vehicle, and information of the vehicle anti-theft device 100. For example, the server device 300 is implemented by a so-called mainframe, which is an information processing device such as a general purpose computer and a workstation.

For example, the server device 300 includes an arithmetic device (arithmetic unit) that executes various types of processing according to an instruction from an operator, a storage device (storage unit) that stores information of users and information of the vehicle anti-theft device 100, and a communication device (communication unit) that communicates with the vehicle anti-theft device 100. Note that the information of users includes personal information such as a name, an address, and a telephone number, and a payment status of a car loan, for example. The information of the vehicle anti-theft device 100 includes a serial number, and an identification number of a communication module to which a relay ON signal is transmitted, for example.

As will be described later, a car loan company transmits a relay ON signal from the server device 300 to the vehicle anti-theft device 100 of a user who is in arrears with a car loan and who cannot be reached, or a user who does not respond to a payment request. By the transmission of the relay ON signal, the car loan company causes consumption of a battery of the vehicle to which the vehicle anti-theft device 100 is installed, and prevents start-up of an engine. Details of such a series of anti-theft processing will be described later.

Figure 2:
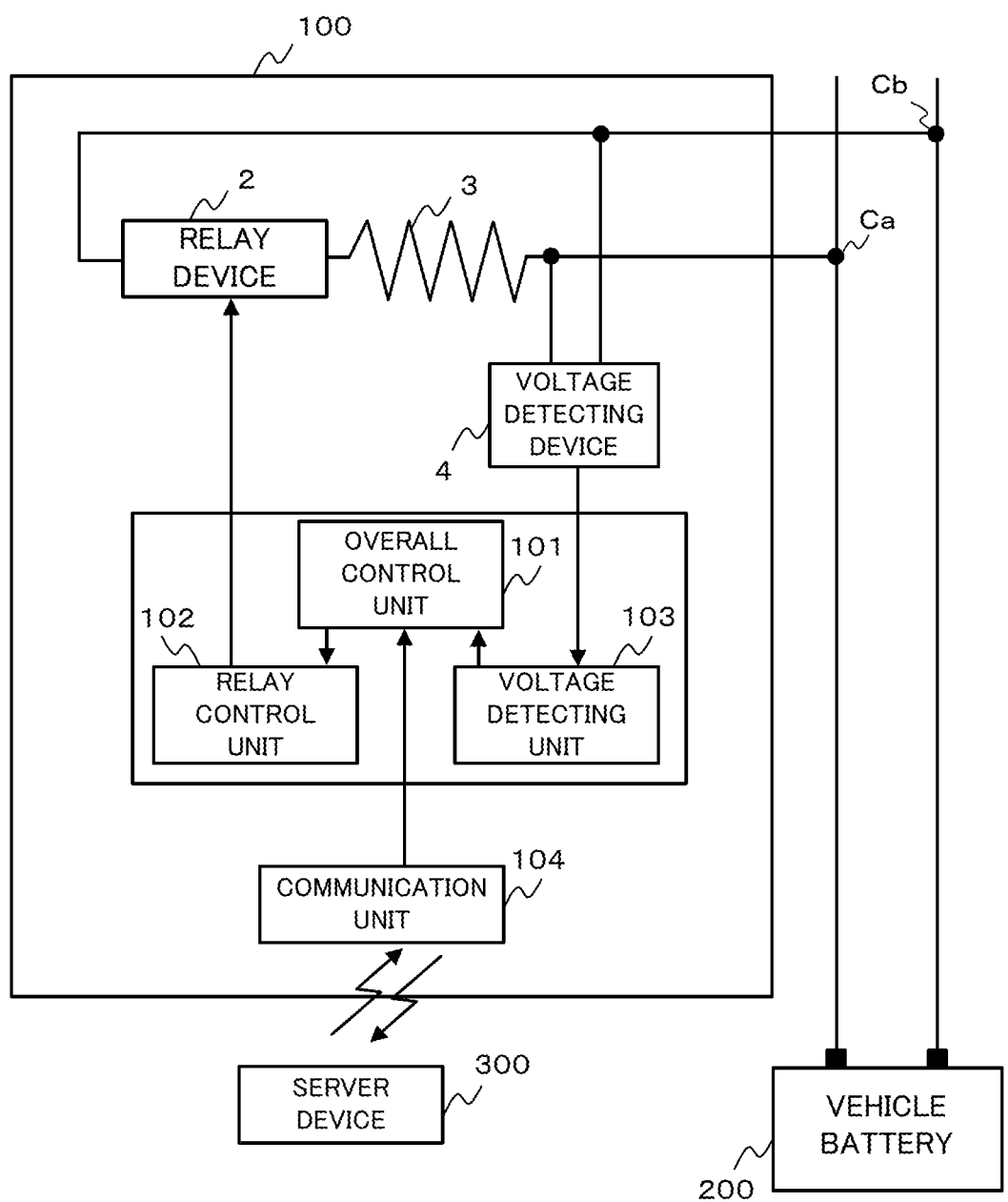
FIG. 2 is a functional block diagram illustrating an example of a functional configuration of the vehicle anti-theft device according to the first embodiment.

FIG. 2 is a functional block diagram illustrating an example of a functional configuration of the vehicle anti-theft device 100. The vehicle anti-theft device 100 includes an overall control unit 101, a relay control unit 102, a voltage detecting unit 103, a communication unit 104, and connectors Ca and Cb.

The overall control unit 101 is a central function unit that controls various types of processing of the vehicle anti-theft device 100. Specifically, when the overall control unit 101 acquires a relay ON signal through the communication unit 104, the overall control unit 101 outputs an instruction of turning on the switch of the relay device 2 to the relay control unit 102. When a voltage of the vehicle battery 200 acquired from the voltage detecting unit 103 is a predetermined value or less (e.g., 11.5 V or less), the overall control unit 101 outputs an instruction of turning off the relay device 2 to the relay control unit 102.

The relay control unit 102 is a function unit that controls the switch of the relay device 2. Specifically, when the relay control unit 102 receives the instruction of turning on the switch of the relay device 2 from the overall control unit 101, the relay control unit 102 outputs an electrical signal to the relay device 2. When the relay control unit 102 receives the instruction of turning off the switch of the relay device 2 from the overall control unit 101, the relay control unit 102 stops the output of the electrical signal to the relay device 2.

The voltage detecting unit 103 is a function unit that detects a voltage. The voltage detecting unit 103 acquires a voltage of the vehicle battery 200 from the voltage detecting device 4, and outputs the acquired voltage to the overall control unit 101.

The communication unit 104 is a function unit that transmits and receives information to and from an external device (in this example, the server device 300). Specifically, the communication unit 104 receives the relay ON signal, which is a signal for instructing power consumption of the vehicle battery 200, from the server device 300, and outputs the received signal to the overall control unit 101.

The connectors Ca and Cb are connectors that electrically connect the vehicle anti-theft device 100 and the vehicle battery 200. Specifically, the connector Ca is connected to the positive electrode of the vehicle battery 200, and the connector Cb is connected to the frame ground of the vehicle frame having the same potential as the potential of the negative electrode of the vehicle battery 200.

Note that the overall control unit 101, the relay control unit 102, and the voltage detecting unit 103 of the vehicle anti-theft device 100 are implemented by programs that cause the CPU to perform processing. These programs are stored in the ROM. When being executed, the programs are loaded in the RAM, and are then executed by the CPU. Note that the communication unit 104 is implemented by the communication module 5. The connectors Ca and Cb are implemented with predetermined connection terminals for connecting to the vehicle battery 200.

Each functional block is classified according to its main details of processing, for the sake of easier understanding of the functions of the vehicle anti-theft device 100 implemented in the present embodiment. Therefore, how each function is classified and referred to does not limit the present invention. Each configuration of the vehicle anti-theft device 100 can be classified into more components, according to details of processing. Each configuration can be classified so that one component executes more processing.

All or a part of the function units included in the vehicle anti-theft device 100 may be constructed by hardware (an integrated circuit such as an ASIC, or the like) implemented in a computer. Processing of the function units included in the vehicle anti-theft device 100 may be executed by one piece of hardware, or may be executed by a plurality of pieces of hardware.

Description of Operation

Figure 3:
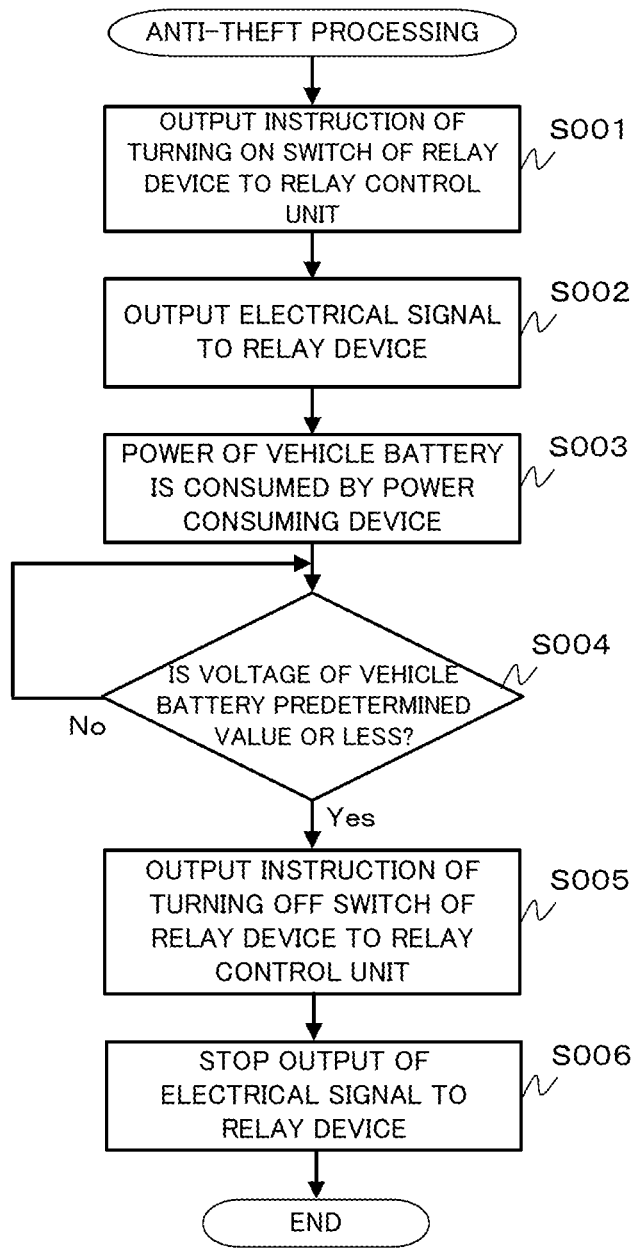
FIG. 3 is a flowchart illustrating an example of anti-theft processing according to the first embodiment.

FIG. 3 is a flowchart illustrating an example of anti-theft processing according to the first embodiment. The anti-theft processing is started when the communication unit 104 receives a relay ON signal from the server device 300. Note that a car loan company transmits a relay ON signal to the vehicle anti-theft device 100 through the server device 300, if there is a predetermined reason such as a user being in arrears with a car loan.

When the anti-theft processing is started, the overall control unit 101 outputs an instruction of turning on the switch of the relay device 2 to the relay control unit 102 (Step S001). When the relay control unit 102 receives the instruction from the overall control unit 101, the relay control unit 102 outputs an electrical signal to the relay device 2 (Step S002). When the switch of the relay device 2 is turned on, an electric current of the vehicle battery 200 flows through the power consuming device 3, and thus power of the vehicle battery 200 is consumed by the power consuming device 3 (Step S003).

Next, the overall control unit 101 determines whether or not a voltage acquired from the voltage detecting unit 103 is a predetermined value or less (e.g., 11.5 V or less) (Step S004). Then, if the overall control unit 101 determines that the voltage is not the predetermined value or less (No in Step S004), the overall control unit 101 executes the processing of Step S004 again. On the other hand, if the overall control unit 101 determines that the voltage is the predetermined value or less (Yes in Step S004), the overall control unit 101 outputs an instruction of turning off the relay device 2 to the relay control unit 102 (Step S005). When the relay control unit 102 receives the instruction from the overall control unit 101, the relay control unit 102 stops the output of the electrical signal to the relay device (Step S006), and terminates the processing of this flow.

The vehicle anti-theft device 100 according to the first embodiment has been described in the above. Such a vehicle anti-theft device 100 is connected between the positive electrode of the vehicle battery 200 and the frame ground. Therefore, for example, a bypass that allows an electric current from the vehicle battery 200 to flow in a different path cannot be arranged, and moreover, the vehicle anti-theft device 100 can be more easily installed to a vehicle.

The vehicle anti-theft device 100 can remotely cause consumption of the vehicle battery 200 until power is reduced to or below power that is necessary for activating a starter for starting an engine of a vehicle. Specifically, a car loan company can remotely cause consumption of power of the vehicle battery 200 of a user who is in arrears with a car loan and who does not respond to a payment request, and can thereby prevent start-up of an engine. Consequently, the car loan company can prevent stealing (unpermitted keeping) of a vehicle.

Second Embodiment

Next, a second embodiment of the present invention will be described. A vehicle anti-theft device 100 according to the present embodiment consumes power of the vehicle battery 200 if the vehicle anti-theft device 100 does not receive a timer reset signal before a predetermined time period (e.g., two weeks) set in an embedded timer 6 elapses. In the following, configurations different from the configurations of the above-described first embodiment will be mainly described, and configurations similar to the configurations of the first embodiment are denoted by the same reference signs to omit description thereof.

Figure 4:
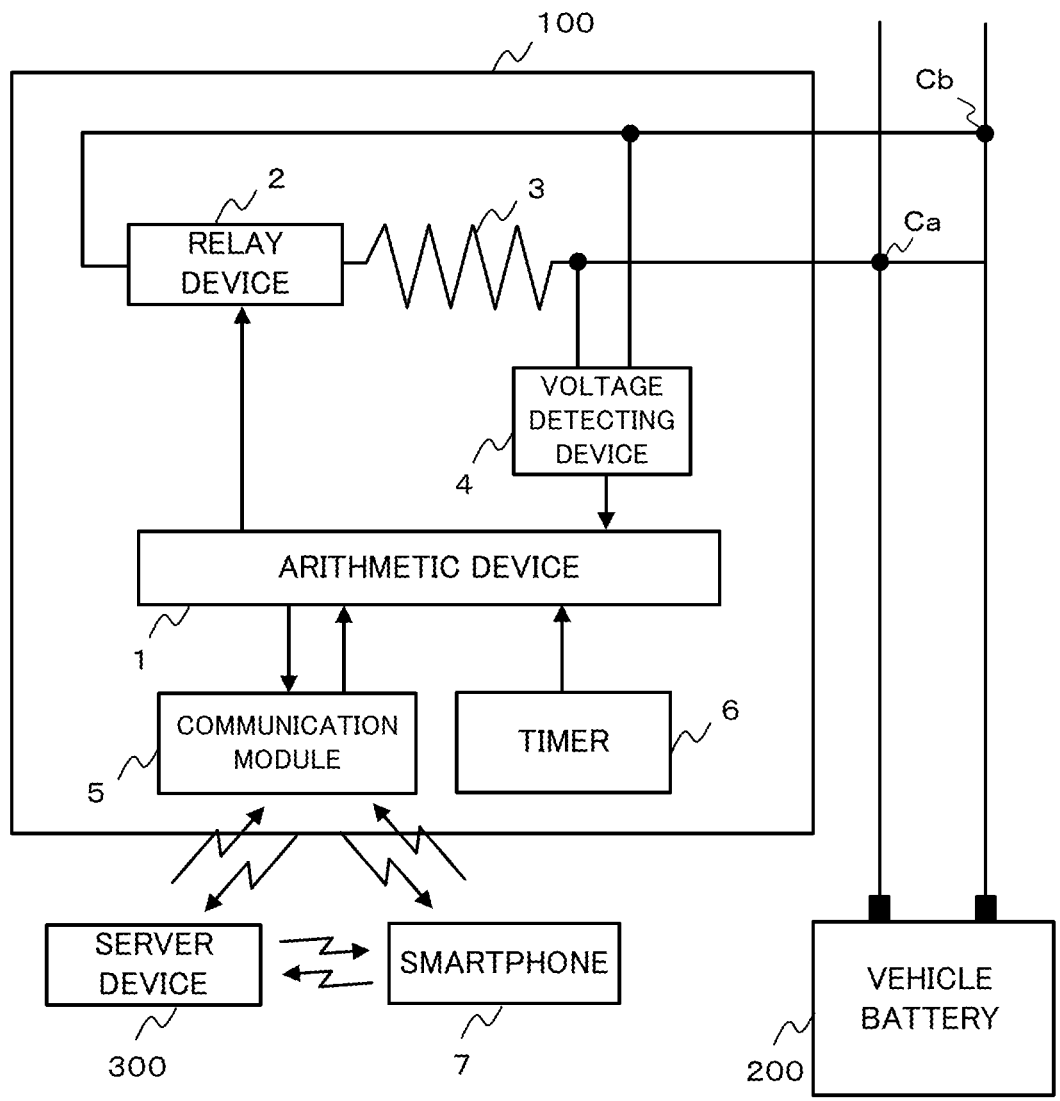
FIG. 4 is a diagram illustrating an example of a schematic configuration of a vehicle anti-theft device according to a second embodiment.

FIG. 4 is a diagram illustrating an example of a schematic configuration of the vehicle anti-theft device 100 according to the second embodiment. The vehicle anti-theft device 100 includes the timer 6, in addition to the configurations according to the first embodiment. The timer outputs an elapsed time period from predetermined time (e.g., the last reset time) to the overall control unit 101.

The communication unit 104 (communication module 5) is connected to the server device 300 so as to be capable of direct communication. Alternatively, the communication unit 104 (communication module 5) is connected to a smartphone 7 or a tablet terminal installing an application for transmitting and receiving information to and from the server device 300 via Bluetooth (trademark), and is thereby connected to the server device 300 so as to be capable of indirect communication.

The overall control unit 101 transmits an acquisition request of a timer reset signal to the server device 300 at predetermined timing. Specifically, if the communication unit 104 and the server device 300 can be directly communicated with each other, the overall control unit 101 transmits an acquisition request of a timer reset signal to the server device 300 at regular intervals (e.g., once a day, once in every 10 days, or the like) from the last timer reset time. If the communication unit 104 is connected with the server device 300 so as to be capable of indirect communication through the smartphone 7 or the like, the overall control unit 101 transmits an acquisition request of a timer reset signal to the server device 300 at predetermined timing (e.g., time at which the communication unit 104 and the smartphone 7 or the like are connected to each other via Bluetooth). When the overall control unit 101 acquires the timer reset signal from the server device 300 through the communication unit 104, the overall control unit 101 resets the elapsed time period of the timer 6.

On the other hand, if the overall control unit 101 fails to acquire the timer reset signal from the server device 300 before the predetermined time period (e.g., two weeks) elapses, the overall control unit 101 outputs an instruction of turning on the relay device 2 to the relay control unit 102. Specifically, even when a user does not carry out connection to the server device 300, with a predetermined reason such as a user being in arrears with the payment, a car loan company can cause consumption of power of the vehicle battery 200.

Figure 5:
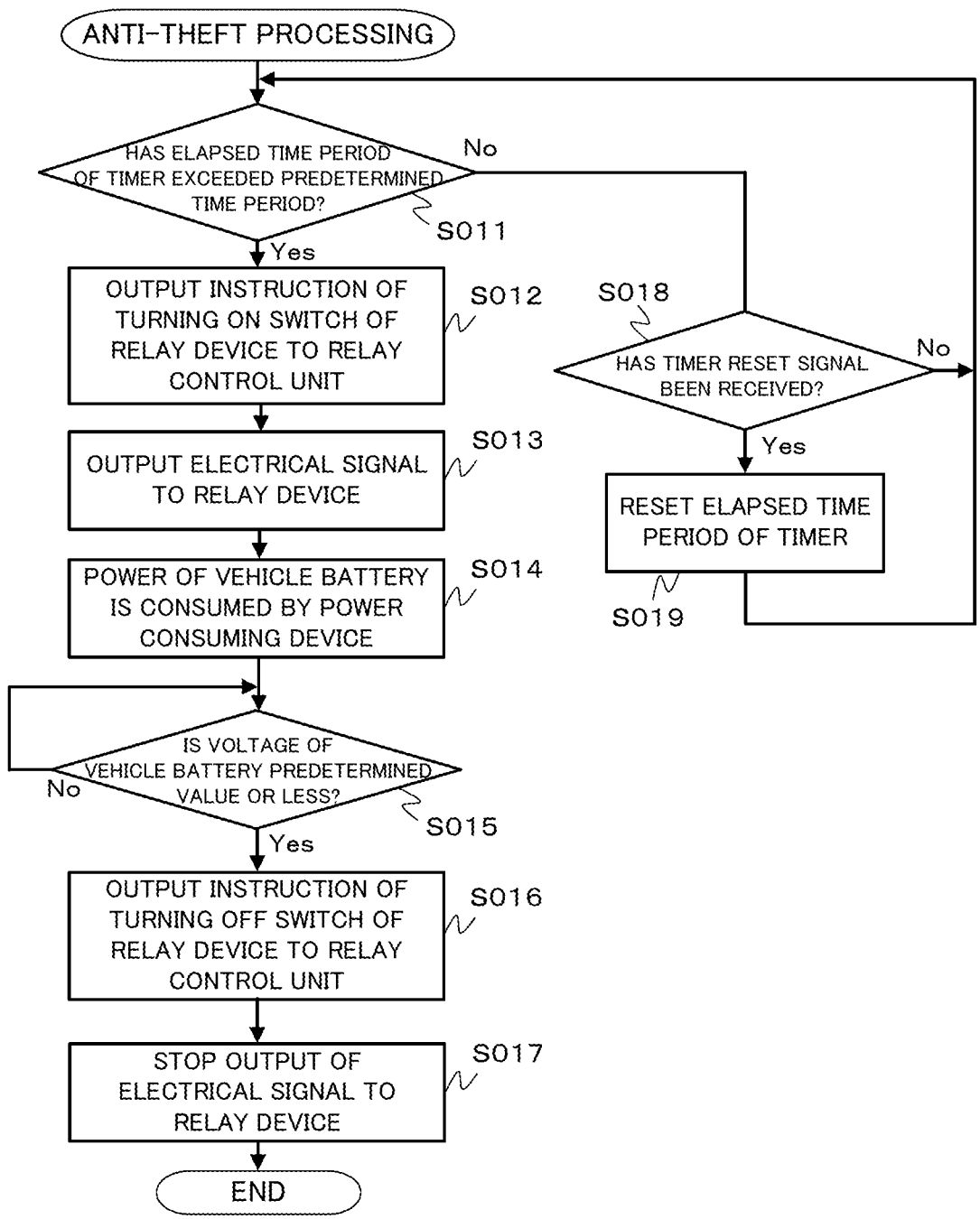
FIG. 5 is a flowchart illustrating an example of anti-theft processing according to the second embodiment.

FIG. 5 is a flowchart illustrating an example of anti-theft processing according to the second embodiment. The anti-theft processing is started from the last reset time of the timer 6, for example.

When the anti-theft processing is started, the timer 6 outputs an elapsed time period to the overall control unit 101. The overall control unit 101 determines whether or not the elapsed time period of the timer 6 exceeds a predetermined time period (e.g., two weeks) (Step S011). Then, if the overall control unit 101 determines that the predetermined time period has not elapsed (No in Step S011), the overall control unit 101 proceeds the processing to Step S018. On the other hand, if the overall control unit 101 determines that the predetermined time period has elapsed (Yes in Step S011), the overall control unit 101 outputs an instruction of turning on the switch of the relay device 2 to the relay control unit 102 (Step S012). Note that the following processing of Step S013 to Step S017 is similar to the processing of Step S002 to Step S006 described above, and thus description thereof is omitted.

In Step S018, the overall control unit 101 determines whether or not a timer reset signal has been received from the server device 300. Then, if the overall control unit 101 determines that a timer reset signal has not been received (No in Step S018), the overall control unit 101 returns the processing to Step S011. On the other hand, if the overall control unit 101 determines that a timer reset signal has been received (Yes in Step S018), the overall control unit 101 resets the elapsed time period of the timer 6 (Step S019), and proceeds the processing to Step S011.

The vehicle anti-theft device 100 according to the second embodiment has been described in the above. Such a vehicle anti-theft device 100 according to the second embodiment can cause consumption of the vehicle battery 200, and can prevent unpermitted keeping of a vehicle, even when the vehicle is kept at a place where communication is unavailable (e.g., an underground car parking or the like), or even when a communication antenna (not illustrated) connected to the communication module 5 is removed.

By adopting the configuration allowing communication with the server device 300 through the smartphone 7 or the like, communication costs for the use of a SIM card in the communication module 5 can be reduced, for example. Note that a good user who continues paying for a car loan only needs to connect the smartphone 7 and the communication module 5 to each other via Bluetooth before a predetermined time period elapses from the last timer reset time (e.g., time at which the communication unit 104 communicated with the server device 300 through the smartphone 7 when the user last got in the vehicle). In this manner, a timer reset signal can be acquired from the server device 300, and a problem that an engine is not started due to consumption of the vehicle battery 200 does not therefore occur for such user.

Third Embodiment

Next, a third embodiment of the present invention will be described. A vehicle anti-theft device 100 according to the present embodiment transmits position information of a vehicle to the server device 300. The vehicle anti-theft device 100 according to the present embodiment can be applied to the basic configuration of any of the first embodiment and the second embodiment. In the following, configurations different from the configurations of the first embodiment and the second embodiment will be mainly described, and configurations similar to the configurations of these embodiments are denoted by the same reference signs to omit description thereof.

Figure 6:
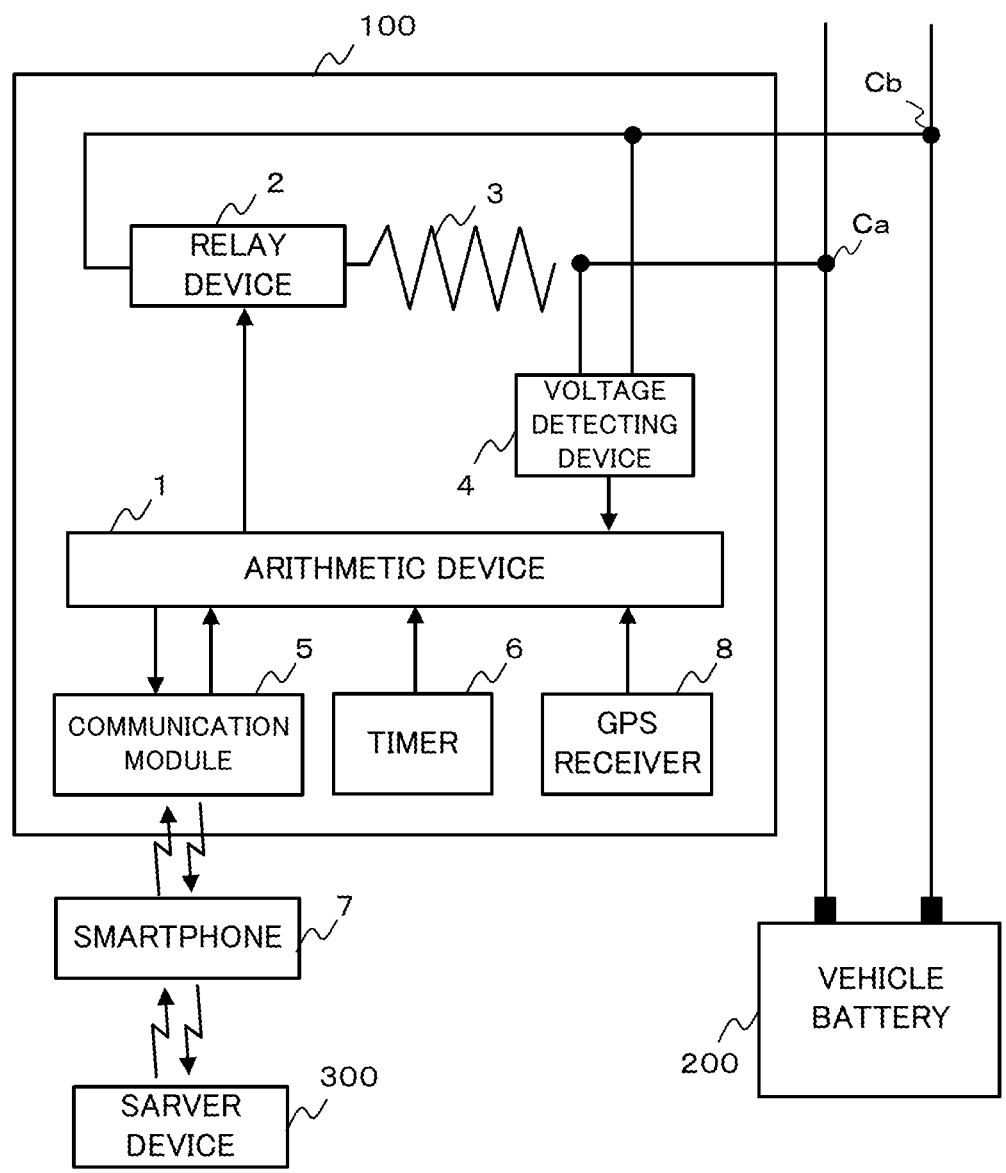
FIG. 6 is a diagram illustrating an example of a schematic configuration of a vehicle anti-theft device according to a third embodiment.

FIG. 6 is a diagram illustrating an example of a schematic configuration of the vehicle anti-theft device 100 according to the third embodiment. The vehicle anti-theft device 100 includes a Global Positioning System (GPS) receiver 8, in addition to the configurations according to the first embodiment or the second embodiment (FIG. 6 illustrates the basic configuration according to the second embodiment). The GPS receiver 8 is a device that receives signals from GPS satellites, and measures, with regard to three or more satellites, a distance between a vehicle and each of GPS satellites and a change rate of the distance, to thereby measure a current position, a moving speed, and a moving direction of the vehicle. The GPS receiver 8 outputs position information indicating the current position of the vehicle to the overall control unit 101 at regular intervals (e.g., once every minute). Note that, if a car navigation device is mounted on the vehicle and the car navigation device includes a GPS receiver 8, the vehicle anti-theft device 100 may use the GPS receiver 8 of the car navigation device.

The overall control unit 101 transmits, to the server device 300, position information indicating the most recent vehicle position acquired from the GPS receiver 8 through the communication unit 104, at predetermined timing or at regular intervals (e.g., once every hour). Examples of the predetermined timing include time at which the overall control unit 101 receives an acquisition request of position information from the server device 300, time at which the overall control unit 101 outputs an instruction of turning on the switch of the relay device 2 to the relay control unit 102, and time at which the overall control unit 101 determines that a voltage of the vehicle battery 200 is equal to or less than a predetermined value.

Note that the vehicle anti-theft device 100 according to the present embodiment executes anti-theft processing similar to the anti-theft processing in the first embodiment or the second embodiment. Specifically, the processing of transmitting the current position of the vehicle to the server device 300 is processing executed in parallel with the anti-theft processing.

The vehicle anti-theft device 100 according to the third embodiment has been described in the above. Such a vehicle anti-theft device 100 according to the third embodiment can allow a car loan company to be informed of a vehicle position, and thus contributes to collection of a vehicle whose power of the vehicle battery 200 has been consumed, as well as contributing to prevention of unpermitted keeping of a vehicle.

Fourth Embodiment

Next, a fourth embodiment of the present invention will be described. A vehicle anti-theft device 100 according to the present embodiment transmits a vehicle position to the server device 300 after detecting its removal from a vehicle. In the following, configurations different from the configurations of the first embodiment to the third embodiment will be mainly described, and configurations similar to the configurations of these embodiments are denoted by the same reference signs to omit description thereof.

Figure 7:
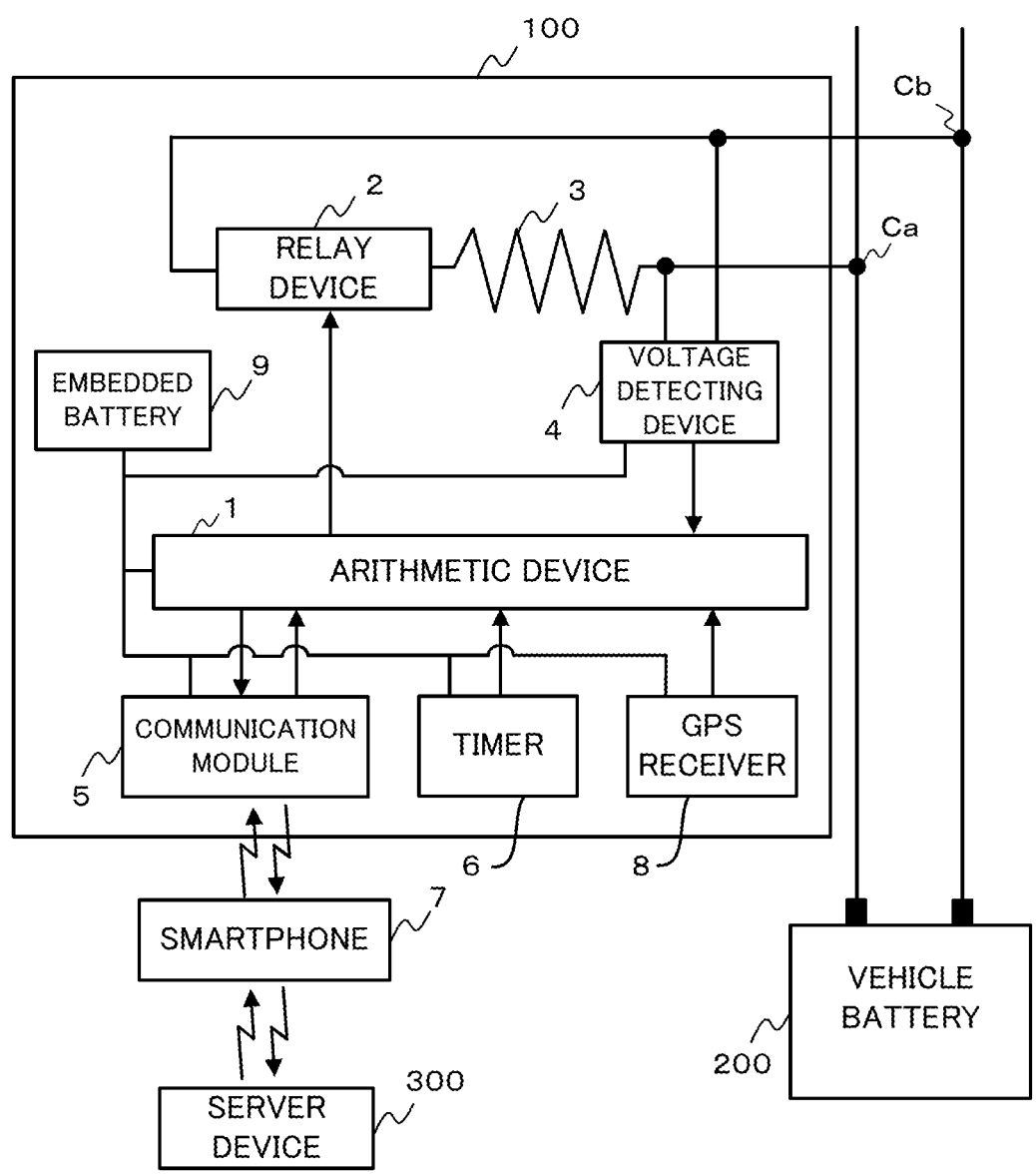
FIG. 7 is a diagram illustrating an example of a schematic configuration of a vehicle anti-theft device according to a fourth embodiment.

FIG. 7 is a diagram illustrating an example of a schematic configuration of the vehicle anti-theft device 100 according to the fourth embodiment. The vehicle anti-theft device 100 includes an embedded battery 9, in addition to the basic configuration according to the third embodiment. The embedded battery 9 is a power supply device that supplies power to the arithmetic device 1, the communication module 5, the timer 6, and the GPS receiver 8, when power supply from the vehicle battery 200 stops.

When the vehicle anti-theft device 100 is removed from the vehicle, a voltage detected by the voltage detecting device 4 is 0 V. When the voltage is 0 V, the overall control unit 101 receives power supply from the embedded battery 9 to maintain its activated state.

If a voltage acquired from the voltage detecting unit 103 is 0 V, the overall control unit 101 specifies a vehicle position, based on information acquired from the GPS receiver 8. The overall control unit 101 further generates information indicating that the vehicle anti-theft device 100 has been removed from the vehicle, and transmits the generated information to the server device 300, together with the position information indicating the vehicle position.

Figure 8:
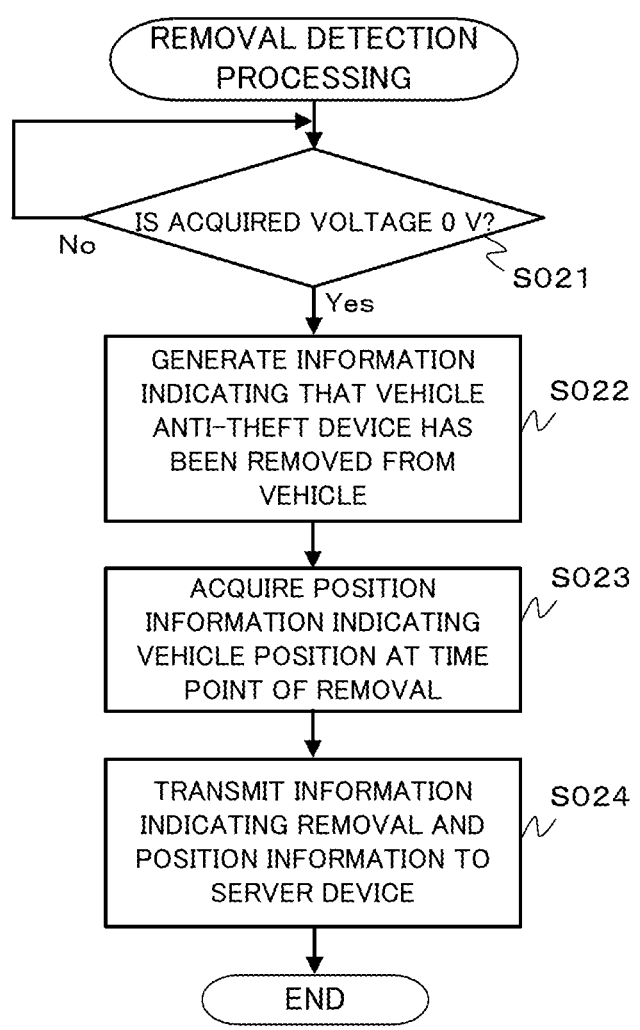
FIG. 8 is a flowchart illustrating an example of removal detection processing according to the fourth embodiment.

FIG. 8 is a flowchart illustrating an example of removal detection processing according to the fourth embodiment. The processing is started at the time of activation of the vehicle anti-theft device 100.

When the anti-theft processing is started, the overall control unit 101 determines whether or not a voltage acquired from the voltage detecting unit 103 is 0 V (Step S021). If the overall control unit 101 determines that the voltage is not 0 V (No in Step S021), the overall control unit 101 executes the processing of Step S021 again. On the other hand, if the overall control unit 101 determines that the voltage is 0 V (Yes in Step S021), the overall control unit 101 receives power supply from the embedded battery 9 to maintain its activated state, and generates information indicating that the vehicle anti-theft device 100 has been removed from the vehicle (Step S022). The overall control unit 101 acquires, from the GPS receiver 8, position information indicating a vehicle position at the time point of the removal (Step S023), transmits these pieces of information to the server device 300 through the communication unit 104 (Step S024), and terminates the processing of this flow.

The vehicle anti-theft device 100 according to the fourth embodiment has been described in the above. With such a vehicle anti-theft device 100 according to the fourth embodiment, even when the vehicle anti-theft device 100 is removed from a vehicle, a vehicle position at the time point of the removal can be informed. Therefore, for example, a car loan company can be informed of unauthorized removal of the vehicle anti-theft device 100 from a vehicle, and can be simultaneously informed of a vehicle position where the removal is conducted.

Note that the vehicle anti-theft device 100 according to the present embodiment can execute anti-theft processing similar to the anti-theft processing of the first embodiment or the second embodiment. The vehicle anti-theft device 100 according to the present embodiment can also execute the processing of transmitting a current position of a vehicle to the server device 300 at predetermined timing, as in the third embodiment.

Fifth Embodiment

Next, a fifth embodiment of the present invention will be described. A vehicle anti-theft system 400 according to the present embodiment has such a redundant configuration that a plurality of (e.g., two) vehicle anti-theft devices 100 are installed to one vehicle, to enable consumption of power of the vehicle battery 200 in the event that one of the vehicle anti-theft devices 100 is removed. In the following, configurations different from the configurations of the first embodiment to the fourth embodiment will be mainly described, and configurations similar to the configurations of these embodiments are denoted by the same reference signs to omit description thereof.

Figure 9:
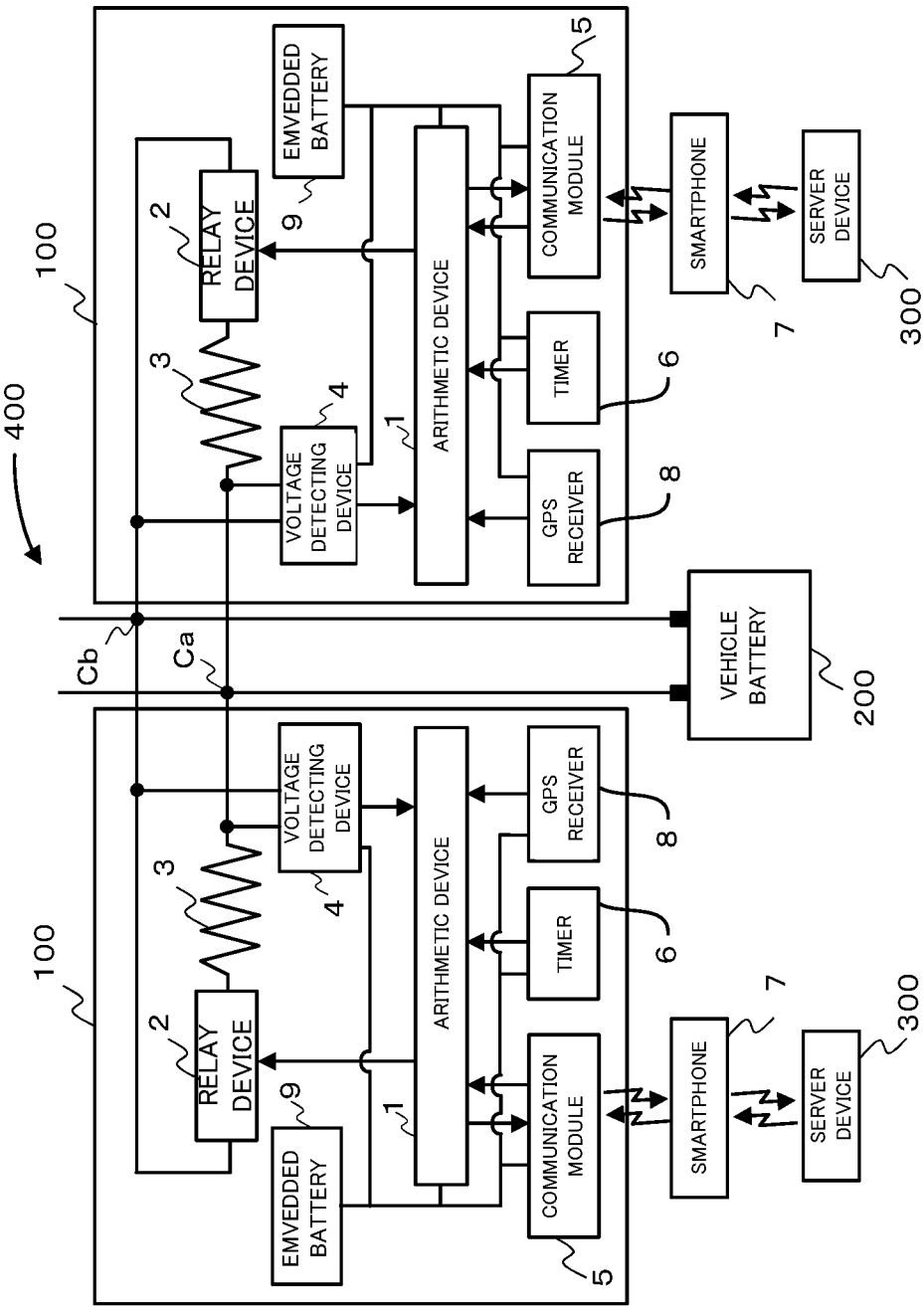
FIG. 9 is a diagram illustrating an example of a schematic configuration of a vehicle anti-theft system according to a fifth embodiment.

FIG. 9 is a diagram illustrating an example of a schematic configuration of the vehicle anti-theft system 400 according to the fifth embodiment. The vehicle anti-theft system 400 includes a plurality of (at least two) vehicle anti-theft devices 100. Note that each of the vehicle anti-theft devices 100 has a configuration similar to the configuration of the vehicle anti-theft device 100 according to the fourth embodiment, and can execute processing similar to the processing of the first embodiment to the fourth embodiment.

Specifically, one vehicle anti-theft device 100 that is removed from a vehicle executes the removal detection processing according to the fourth embodiment, and transmits information indicating the removal from the vehicle and a vehicle position at the time point of the removal to the server device 300. When a car loan company is informed that the vehicle anti-theft device 100 has been removed through the server device 300, the car loan company transmits a relay ON signal to another vehicle anti-theft device 100 that is installed in the same vehicle. Note that the car loan company may not transmit a timer reset signal to the another vehicle anti-theft device 100 from the server device 300.

The another vehicle anti-theft device 100 that has received the relay ON signal executes the anti-theft processing according to the first embodiment, and causes consumption of power of the vehicle battery 200.

Such a vehicle anti-theft system 400 according to the fifth embodiment can allow a car loan company to be informed of a vehicle position at the time point when a vehicle anti-theft device 100 is removed from a vehicle, and can cause consumption of power of the vehicle battery 200 to prevent start-up of an engine.

Sixth Embodiment

Next, a sixth embodiment of the present invention will be described. A vehicle anti-theft system 500 according to the present embodiment is the same as the fifth embodiment in the redundant configuration that a plurality of (e.g., two) vehicle anti-theft devices 100 are installed, but is different from the fifth embodiment in that only one of the vehicle anti-theft devices 100 includes a communication unit 104, and in that both of the vehicle anti-theft devices 100 include respective inter-device monitoring devices 10a and 10b that perform mutual monitoring. In the following, configurations different from the configurations of the first embodiment to the fifth embodiment will be mainly described, and configurations similar to the configurations of these embodiments are denoted by the same reference signs to omit description thereof.

Figure 10:
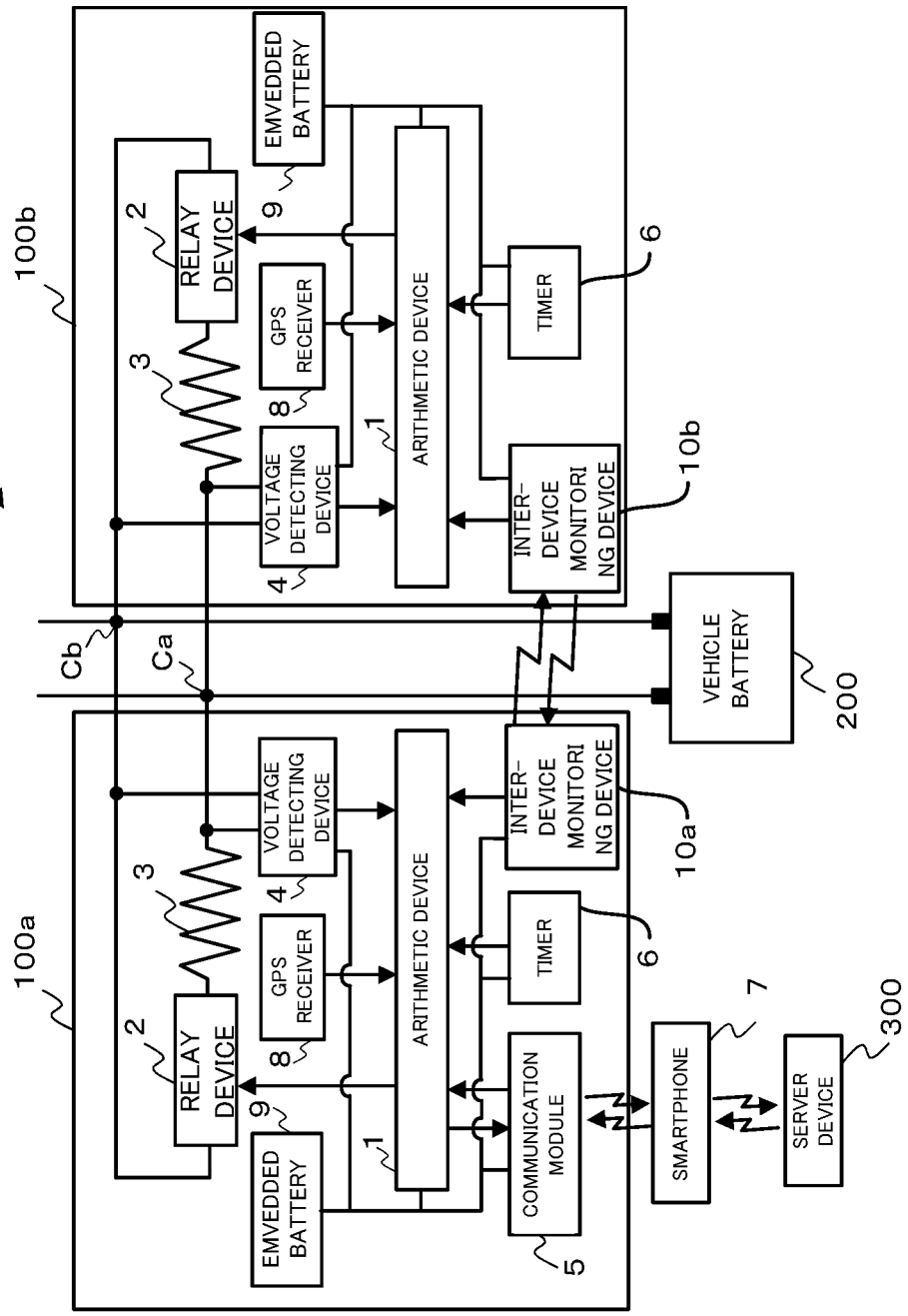
FIG. 10 is a diagram illustrating an example of a schematic configuration of a vehicle anti-theft system according to a sixth embodiment.

FIG. 10 is a diagram illustrating an example of a schematic configuration of the vehicle anti-theft system 500 according to the sixth embodiment. The vehicle anti-theft system 500 includes a plurality of (at least two) vehicle anti-theft devices 100. As illustrated in FIG. 10, a vehicle anti-theft device 100a serving as a master unit includes a communication unit 104 (communication module 5), and is communicably connected to the server device 300. By contrast, a vehicle anti-theft device 100b serving as a slave unit does not include a communication unit 104.

The vehicle anti-theft devices 100a and 100b include inter-device monitoring devices 10a and 10b, respectively. The inter-device monitoring device 10a on the master unit side and the inter-device monitoring device 10b on the slave unit side are connected so as to be capable of mutual communication, in accordance with a predetermined wireless communication standard such as Bluetooth, for example. The inter-device monitoring device 10a on the master unit side monitors a state of the vehicle anti-theft device 100b on the slave unit side, and the inter-device monitoring device 10b on the slave unit side monitors a state of the vehicle anti-theft device 100a on the master unit side.

Specifically, the inter-device monitoring device 10a on the master unit side monitors a voltage state of the vehicle anti-theft device 100b, to which the inter-device monitoring device 10b on the slave unit side is installed. More specifically, the inter-device monitoring device 10a on the master unit side transmits an acquisition request of a voltage value of the vehicle anti-theft device 100b on the slave unit side to the inter-device monitoring device 10b on the slave unit side, at regular intervals (e.g., once every second). The inter-device monitoring device 10b on the slave unit side acquires a voltage value of a vehicle battery of the vehicle anti-theft device 100b through the overall control unit 101 on the slave unit side, and transmits the acquired voltage value to the inter-device monitoring device 10a on the master unit side. When the inter-device monitoring device 10a on the master unit side acquires the voltage value of the vehicle anti-theft device 100b on the slave unit side, the inter-device monitoring device 10a on the master unit side outputs the acquired voltage value to the overall control unit 101 on the master unit side.

The inter-device monitoring device 10b on the slave unit side monitors a voltage state of the vehicle anti-theft device 100a, to which the inter-device monitoring device 10a on the master unit side is installed. Specifically, the inter-device monitoring device 10b on the slave unit side transmits an acquisition request of a voltage value of the vehicle anti-theft device 100a on the master unit side to the inter-device monitoring device 10a on the master unit side, at regular intervals (e.g., once every second). The inter-device monitoring device 10a on the master unit side acquires a voltage value of a vehicle battery of the vehicle anti-theft device 100a through the overall control unit 101 on the master unit side, and transmits the acquired voltage value to the inter-device monitoring device 10b on the slave unit side. When the inter-device monitoring device 10b on the slave unit side acquires the voltage value of the vehicle anti-theft device 100a on the master unit side, the inter-device monitoring device 10b on the slave unit side outputs the acquired voltage value to the overall control unit 101 on the slave unit side.

Each of the overall control units 101 on the master unit side and the slave unit side determines whether or not the voltage value acquired from the inter-device monitoring device 10a or 10b of the other unit is 0 V, and performs predetermined processing, depending on the determination results.

Figure 11:
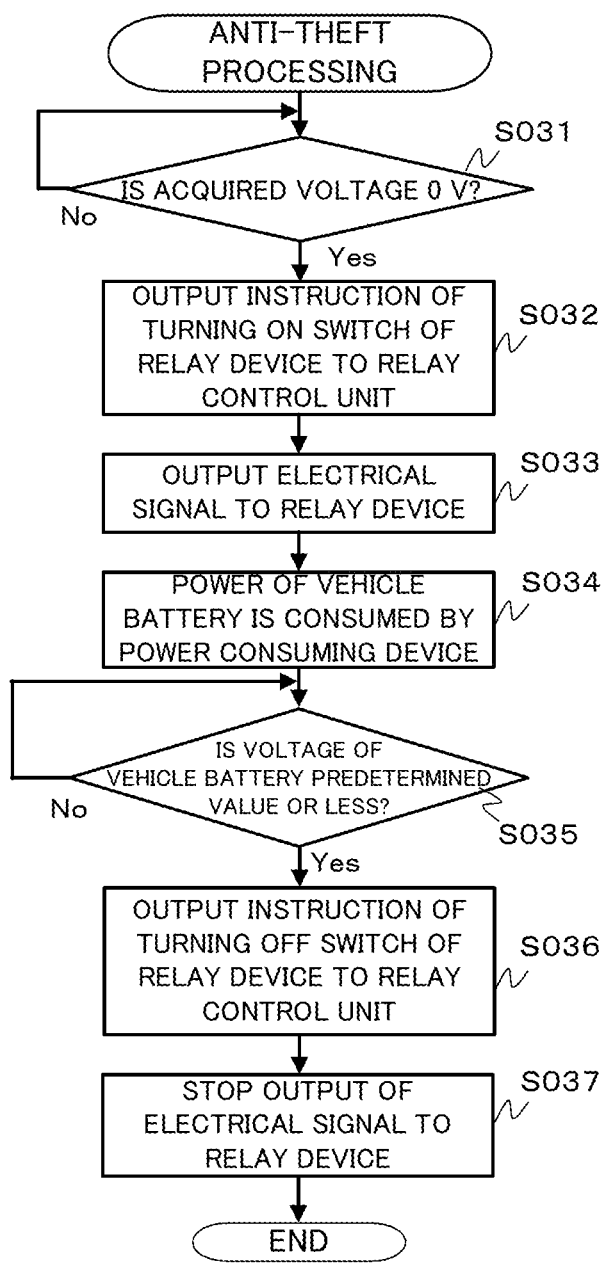
FIG. 11 is a flowchart illustrating an example of anti-theft processing of a vehicle anti-theft device on a slave unit side according to the sixth embodiment.

Case where Vehicle Anti-Theft Device 100a on Master Unit Side Is Removed from Vehicle (1) Processing of Vehicle Anti-Theft Device 100b on Slave Unit Side FIG. 11 is a flowchart illustrating an example of anti-theft processing of the vehicle anti-theft device 100b on the slave unit side. The processing is started when the overall control unit 101 on the slave unit side acquires a voltage value of the vehicle anti-theft device 100a on the master unit side.

When the anti-theft processing is started, the overall control unit 101 determines whether or not a voltage of the vehicle anti-theft device 100a on the master unit side acquired through the inter-device monitoring device 10b is 0 V (Step S031). Then, if the overall control unit 101 determines that the voltage is not 0 V (No in Step S031), the overall control unit 101 executes the processing of Step S031 again. On the other hand, if the overall control unit 101 determines that the voltage is 0 V (Yes in Step S031), the overall control unit 101 outputs an instruction of turning on the switch of the relay device 2 to the relay control unit 102 (Step S032). Note that the overall control unit 101 may not necessarily output an instruction of turning on the switch of the relay device 2 immediately after detecting that the voltage of the vehicle anti-theft device 100a is 0 V. Instead, for example, the overall control unit 101 may output the instruction after a predetermined time period (e.g., several hours to several days) elapses. This is because the vehicle anti-theft device 100a on the master unit side may be removed due to a malfunction, for example, and therefore time for checking with a user about a situation needs to be taken into consideration.

The following processing of Step S033 to Step S037 is similar to the processing of Step S013 to Step S017 of the second embodiment, and thus description thereof is omitted.

(2) Removal Detection Processing on Master Unit Side

When the vehicle anti-theft device 100a on the master unit side is removed from a vehicle, the vehicle anti-theft device 100a performs the removal detection processing according to the fourth embodiment. Note that the vehicle anti-theft device 100a on the master unit side can also execute anti-theft processing similar to the anti-theft processing of the first embodiment to the third embodiment.

Case where Vehicle Anti-Theft Device 100b on Slave Unit Side is Removed from Vehicle When the vehicle anti-theft device 100b on the slave unit side is removed from a vehicle, the vehicle anti-theft device 100a on the master unit side performs the following processing.

Figure 12:
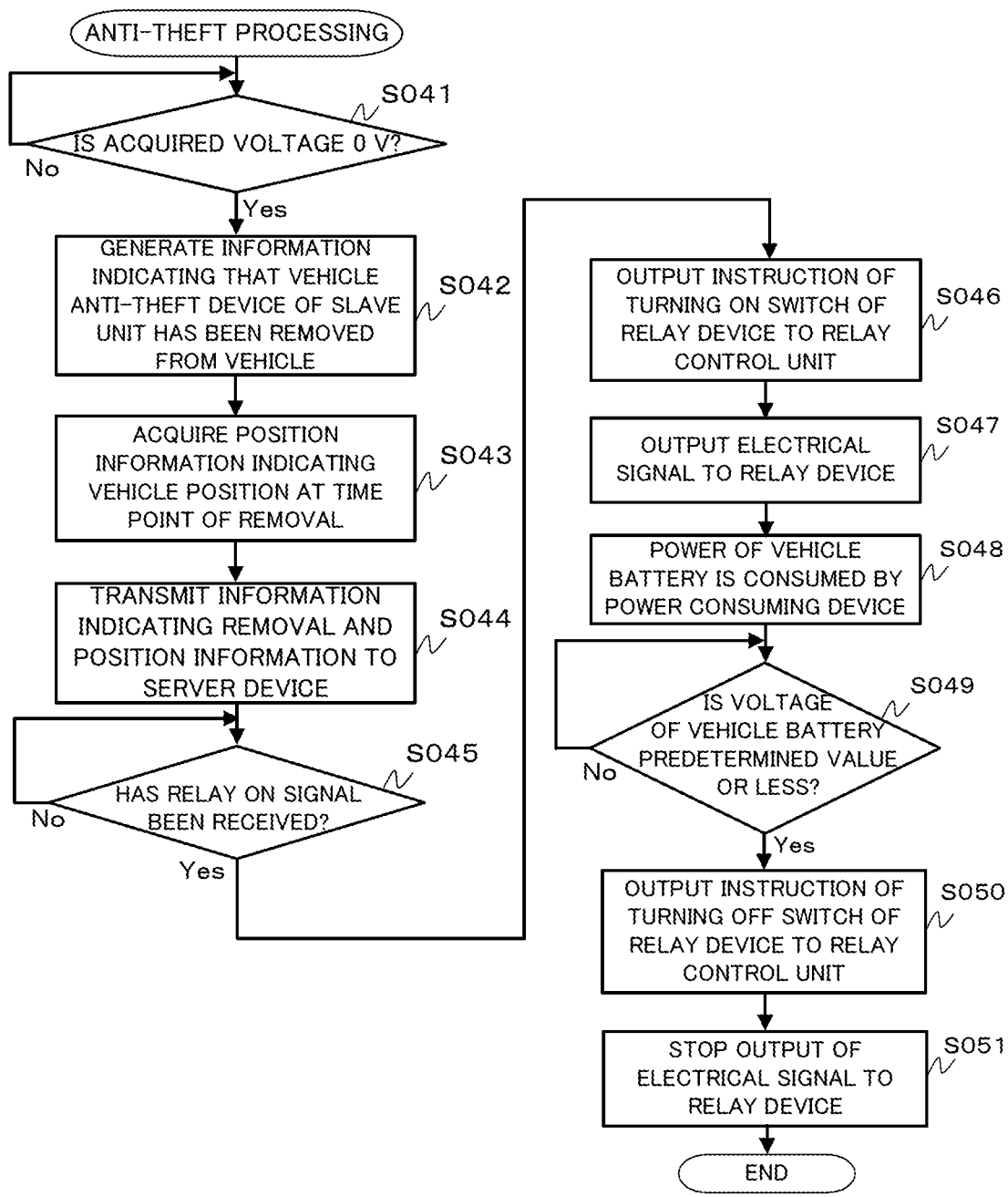
FIG. 12 is a flowchart illustrating an example of anti-theft processing of a vehicle anti-theft device on a master unit side according to the sixth embodiment.

FIG. 12 is a flowchart illustrating an example of anti-theft processing of the vehicle anti-theft device 100a on the master unit side. The processing is started when the overall control unit 101 on the master unit side acquires a voltage value of the vehicle anti-theft device 100*b* on the slave unit side.

When the anti-theft processing is started, the overall control unit 101 determines whether or not a voltage of the vehicle anti-theft device 100*b* on the slave unit side acquired through the inter-device monitoring device 10*a* is 0 V (Step S041). Then, if the overall control unit 101 determines that the voltage is not 0 V (No in Step S041), the overall control unit 101 executes the processing of Step S041 again. On the other hand, if the overall control unit 101 determines that the voltage is 0 V (Yes in Step S041), the overall control unit 101 generates information indicating that the vehicle anti-theft device 100*b* on the slave unit side has been removed from the vehicle (Step S042). The overall control unit 101 further acquires, from the GPS receiver 8, position information indicating a vehicle position at the time point of the removal (Step S043), and transmits these pieces of information to the server device 300 through the communication unit 104 (Step S044).

When a car loan company is informed that the vehicle anti-theft device 100*b* has been removed through the server device 300, the car loan company transmits a relay ON signal to the vehicle anti-theft device 100*a* on the master unit side that is installed to the same vehicle. Note that the car loan company may not transmit a timer reset signal to the vehicle anti-theft device 100*a* on the master unit side from the server device 300.

Next, the overall control unit 101 on the master unit side determines whether or not a relay ON signal has been received from the server device 300 (Step S045). Then, if the overall control unit 101 determines that a relay ON signal has not been received (No in Step S045), the overall control unit 101 executes the processing of Step S045 again. On the other hand, if the overall control unit 101 determines that a relay ON signal has been received (Yes in Step S045), the overall control unit 101 performs control to cause consumption of power of the vehicle battery 200 to the extent of preventing start-up of an engine (Step S046 to Step S051), and terminates the processing of this flow. Note that processing of Step S046 to Step S051 is similar to the processing of Step S001 to Step S006 according to the first embodiment, and thus description thereof is omitted.

With such a vehicle anti-theft system 500 according to the sixth embodiment, a vehicle position at the time point when one of vehicle anti-theft devices 100 is removed from a vehicle can be informed, and moreover, consumption of power of the vehicle battery 200 can be caused using another vehicle anti-theft device 100. Therefore, for example, a car loan company can be informed of unauthorized removal of the vehicle anti-theft device 100 from a vehicle, can be simultaneously informed of a vehicle position where the removal is conducted, and can prevent start-up of an engine of the vehicle. The vehicle anti-theft device 100 according to the present embodiment can reduce communication costs as compared to the fifth embodiment, because only the vehicle anti-theft device 100*a* on the master unit side includes a communication module.

Note that, regarding the power consuming device 3 according to the embodiments described above, an example using a resistor that consumes power by converting an electric current into thermal energy has been described. However, the present invention is not limited to this example. For example, the vehicle anti-theft device 100 and a unit controlling headlamps and interior lights may be communicably connected to each other, and when a relay ON signal is received or when a predetermined time period on the timer 6 expires, power of the vehicle battery 200 may be consumed by outputting an instruction of turning on the headlamps and the interior lights to the control unit via a CAN.

If a navigation device is mounted on a vehicle as an on-board device, the arithmetic device 1, the communication module 5, and the GPS receiver 8 of the vehicle anti-theft device 100 may be replaced with an arithmetic device, a GPS receiver, and a communication module of the navigation device. The navigation device may use a car audio or a display as its power consuming devices. In this case, the navigation device may activate a car audio and a display to cause consumption of power of the vehicle battery 200, and may perform control such that music and a video are output from its car speaker and the display.

Note that the present invention is not limited to the above-described embodiments, modified examples, or the like, and encompasses various embodiments and modified examples other than those described above. For example, the embodiments described above are described in detail for the sake of better understanding of the present invention, and the present invention is not necessarily limited to including all the configurations described herein. It is possible to replace a part of a configuration of one embodiment with a configuration of another embodiment or of a modified example. It is also possible to add a configuration of one embodiment to a configuration of another embodiment. Another configuration can be added to, deleted from, and replaced with a part of a configuration of each embodiment.

A part or all of each configuration, function, processing unit, processing means, and the like described above may be implemented by a program that is used by a processor to implement functions of each of those. Information for implementing each of the functions, such as a program, a table, and a file, may be stored in a storage device such as memory, a hard disk, and a solid state drive (SSD), or in a recording medium such as an IC card, a Secure Digital (SD) memory card, and a digital versatile disk (DVD). Note that illustrations of control lines and information lines are those considered to be necessary for the sake of description, and not necessarily include all the control lines and information lines necessary as a product.

REFERENCE SIGNS LIST

100: Anti-theft device
1: Arithmetic device
2: Relay device
3: Power consuming device
4: Voltage detecting device
5: Communication module
6: Timer
7: Smartphone
8: GPS receiver
9: Embedded battery
10*a*: Inter-device monitoring device of anti-theft device on master unit side
10*b*: Inter-device monitoring device of anti-theft device on slave unit side
200: Vehicle battery
300: Server device
101: Overall control unit
102: Relay control unit
103: Voltage detecting unit
104: Communication unit

What is claimed is:

1. A vehicle anti-theft device comprising:
   connectors configured to be connected to battery cables of a vehicle;
   a communication unit configured to communicate with an external device;
   a power consuming device configured to consume power of a vehicle battery; and
   an overall control unit configured to perform control of causing consumption of power of the vehicle battery by using the power consuming device, when the overall control unit receives a signal for instructing consumption of the vehicle battery from the external device through the communication unit, wherein
   the power consuming device and a relay device are disposed between one of the connectors on a positive electrode side of the battery cables and another of the connectors on a negative electrode side of the battery cables, and
   the overall control unit performs control of turning on a switch of the relay device, when the overall control unit acquires a relay ON signal that is a signal for instructing consumption of the vehicle battery through the communication unit.

2. The vehicle anti-theft device according to claim 1, further comprising a voltage detecting unit configured to detect a voltage of the vehicle battery, wherein when the voltage detecting unit detects that a voltage of the vehicle battery is equal to or lower than a predetermined value, the overall control unit performs control of turning off the switch of the relay device.

3. The vehicle anti-theft device according to claim 1, further comprising a timer in which a predetermined time period is set, wherein the overall control unit resets an elapsed time period of the timer, when the overall control unit acquires a reset signal for the timer from the external device through the communication unit, and performs control of causing consumption of power of the vehicle battery, when the predetermined time period of the timer elapses.

4. The vehicle anti-theft device according to claim 1, further comprising a GPS receiver configured to measure position information of the vehicle, wherein the overall control unit transmits the position information of the vehicle to the external device through the communication unit, at predetermined timing.

5. The vehicle anti-theft device according to claim 4, further comprising a voltage detecting unit configured to detect a voltage of the vehicle battery, wherein the overall control unit transmits the position information of the vehicle to the external device through the communication unit, when the overall control unit detects that the vehicle anti-theft device has been removed from the vehicle, based on a voltage value of the vehicle battery acquired through the voltage detecting unit.

6. A vehicle anti-theft system comprising:
   a plurality of vehicle anti-theft devices, each of the plurality of vehicle anti-theft devices including
      connectors configured to be connected to battery cables of a vehicle,
      a communication unit configured to communicate with an external device,
      a voltage detecting unit configured to detect a voltage of a vehicle battery connected by the connectors,
      a GPS receiver configured to measure position information of the vehicle,
      a power consuming device configured to consume power of the vehicle battery connected by the connectors, and
      an overall control unit configured to perform predetermined control, wherein
   the overall control unit included in one of the plurality of vehicle anti-theft devices transmits the position information of the vehicle to the external device by using the communication unit included in the one of the plurality of vehicle anti-theft devices, when the overall control unit included in the one of the plurality of vehicle anti-theft devices determines that the one of the plurality of vehicle anti-theft devices has been removed from the vehicle, based on a voltage value of the vehicle battery acquired through the voltage detecting unit included in the one of the plurality of vehicle anti-theft devices, and
   the overall control unit included in a vehicle anti-theft device different from the one of the plurality of vehicle anti-theft devices performs control of causing the power consuming device included in the vehicle anti-theft device different from the one of the plurality of vehicle anti-theft devices to operate, when the communication unit included in the vehicle anti-theft device different from the one of the plurality of vehicle anti-theft devices receives an instruction of causing consumption of power of the vehicle battery from the external device.

7. A vehicle anti-theft system comprising:
   a first vehicle anti-theft device including
      connectors configured to be connected to battery cables of a vehicle,
      a communication unit configured to communicate with an external device,
      a power consuming device configured to consume power of a vehicle battery,
      an overall control unit configured to perform control of causing consumption of power of the vehicle battery by using the power consuming device, when the overall control unit receives a signal for instructing consumption of the vehicle battery from the external device through the communication unit, and
      an inter-device monitoring device configured to monitor a power state of another vehicle anti-theft device; and
   a second vehicle anti-theft device including
      the connectors,
      the power consuming device,
      the overall control unit,
      the inter-device monitoring device, and
      a timer in which a predetermined time period is set,
   wherein the overall control unit of the second vehicle anti-theft device activates the timer, when the overall control unit of the second vehicle anti-theft device detects that the first vehicle anti-theft device has been removed from the vehicle, through the inter-device monitoring device of the second vehicle anti-theft device, and performs control of causing consumption of power of the vehicle battery, when the predetermined time period of the timer elapses.

8. The vehicle anti-theft system according to claim 7, wherein the overall control unit of the first vehicle anti-theft device transmits position information of the vehicle to the external device through the communication unit, when the overall control unit of the first vehicle anti-theft device detects that the second vehicle anti-theft device has been removed from the vehicle, through the inter-device monitoring device.

9. A vehicle anti-theft system comprising:
a vehicle anti-theft device, and
an external device configured to communicate with the vehicle anti-theft device, wherein the vehicle anti-theft device includes
connectors configured to be connected to battery cables of a vehicle,
a communication unit configured to communicate with the external device,
a power consuming device configured to consume power of a vehicle battery, and
an overall control unit configured to perform control of consumption of the vehicle battery, wherein:
the external device transmits a signal for instructing consumption of the vehicle battery to the vehicle anti-theft device arranged in the vehicle that may be stolen or that may be kept without permission;
the overall control unit performs control of causing consumption of power of the vehicle battery by using the power consuming device, when the overall control unit receives the signal from the external device through the communication unit; wherein:
the power consuming device and a relay device are disposed between one of the connectors on a positive electrode side of the battery cables and another of the connectors on a negative electrode side of the battery cables; and
the overall control unit performs control of turning on a switch of the relay device, when the overall control unit acquires a relay ON signal that is a signal for instructing consumption of the vehicle battery through the communication unit.

10. A vehicle anti-theft method used in a vehicle anti-theft device that is connected to battery cables of a vehicle, and that includes an overall control unit, a communication unit that communicates with an external device, and a power consuming device that consumes power of a vehicle battery, wherein the power consuming device and a relay device are disposed between one of the connectors on a positive electrode side of the battery cables and another of the connectors on a negative electrode side of the battery cables, the vehicle anti-theft method comprising the steps of:
causing consumption of power of the vehicle battery by using the power consuming device, when a signal for instructing consumption of the vehicle battery is received from the external device through the communication unit; and
controlling by the overall control unit, turning on a switch of the relay device when the overall control unit acquires a relay ON signal that is a signal for instructing consumption of the vehicle battery through the communication unit.

11. An on-board device comprising:
a communication unit configured to communicate with an external device;
a power consuming device configured to consume power of a vehicle battery; and
an overall control unit configured to perform control of causing consumption of power of the vehicle battery by using the power consuming device, when the overall control unit receives a signal for instructing consumption of the vehicle battery from the external device through the communication unit, wherein:
the power consuming device and a relay device are disposed between one of a plurality of connectors on a positive electrode side of battery cables of the vehicle batter, and another of the plurality of connectors on a negative electrode side of the battery cables, and
the overall control unit performs control of turning on a switch of the relay device, when the overall control unit acquires a relay ON signal that is a signal for instructing consumption of the vehicle battery through the communication unit.

\* \* \* \* \*